United States Patent
Bosch et al.

(10) Patent No.: US 7,958,390 B2
(45) Date of Patent: *Jun. 7, 2011

(54) MEMORY DEVICE FOR REPAIRING A NEIGHBORHOOD OF ROWS IN A MEMORY ARRAY USING A PATCH TABLE

(75) Inventors: Derek J. Bosch, Mountain View, CA (US); Christopher S. Moore, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 938 days.

This patent is subject to a terminal disclaimer.

(21) Appl. No.: 11/803,756

(22) Filed: May 15, 2007

(65) Prior Publication Data

US 2008/0285365 A1    Nov. 20, 2008

(51) Int. Cl.
*G06F 11/00* (2006.01)
(52) U.S. Cl. ...... 714/6.13; 714/6.1; 714/6.11; 714/6.32; 365/200; 711/153
(58) Field of Classification Search ............... 714/8, 6.1, 714/6.11, 6.13, 6.32; 365/200; 711/153
See application file for complete search history.

(56) References Cited

U.S. PATENT DOCUMENTS

| | | | |
|---|---|---|---|
| 4,523,313 A | 6/1985 | Nibby et al. | |
| 4,646,266 A | 2/1987 | Ovshinsky et al. | |
| 4,694,454 A * | 9/1987 | Matsuura | 714/6 |
| 5,130,777 A | 7/1992 | Galbraith et al. | |
| 5,278,839 A | 1/1994 | Matsumoto et al. | |
| 5,313,425 A | 5/1994 | Lee et al. | |
| 5,329,488 A | 7/1994 | Hashimoto | |
| 5,359,569 A | 10/1994 | Fujita et al. | |
| 5,379,259 A | 1/1995 | Fujita | |

(Continued)

FOREIGN PATENT DOCUMENTS

GB        2 265 031        9/1993

(Continued)

OTHER PUBLICATIONS

"A 16Mb Mask ROM with Programmable Redundancy," Nsruka et al., ISSCC 1989/Session 10: Nonvolatile Memories/Paper THAM 10.1, 2 pages, Feb. 16, 1989.

(Continued)

*Primary Examiner* — Scott T Baderman
*Assistant Examiner* — Loan Truong
(74) *Attorney, Agent, or Firm* — Brinks Hofer Gilson & Lione

(57) ABSTRACT

A memory device for repairing a neighborhood of rows in a memory array using a patch table is disclosed. In one embodiment, circuitry in the memory device is operative to store, in a temporary storage area of the memory device, (i) first data to be stored in row N in the memory array, (ii) second data, if any, stored in row N−1 in the memory array, and (iii) third data, if any, stored in row N+1 in the memory array. The circuitry is operative to write the first data in row N in the memory array, and, in response to an error in writing the first data, to write the first data, the second data, if any, and the third data, if any, in respective rows in a repair area in the memory device. The circuitry is further operative to add the addresses of rows N−1, N, and N+1 to a table stored in the memory device.

16 Claims, 5 Drawing Sheets

U.S. PATENT DOCUMENTS

| | | | |
|---|---|---|---|
| 5,432,729 A | 7/1995 | Carson et al. | |
| 5,469,450 A | 11/1995 | Cho et al. | |
| 5,498,979 A | 3/1996 | Parlour et al. | |
| 5,535,173 A | 7/1996 | Carre et al. | |
| 5,579,265 A | 11/1996 | Devin | |
| 5,642,318 A | 6/1997 | Knaack et al. | |
| 5,701,267 A | 12/1997 | Masuda et al. | |
| 5,708,667 A | 1/1998 | Hayashi | |
| 5,742,934 A | 4/1998 | Shinohara | |
| 5,748,545 A | 5/1998 | Lee et al. | |
| 5,751,647 A | 5/1998 | O'Toole | |
| 5,757,700 A | 5/1998 | Kobayashi | |
| 5,784,391 A | 7/1998 | Konigsburg | |
| 5,796,694 A | 8/1998 | Shirane | |
| 5,815,448 A * | 9/1998 | Horiguchi et al. | 365/200 |
| 5,831,989 A | 11/1998 | Fujisaki | |
| 5,835,396 A | 11/1998 | Zhang | |
| 5,835,509 A | 11/1998 | Sako et al. | |
| 5,872,790 A | 2/1999 | Dixon | |
| 5,909,049 A | 6/1999 | McCollum | |
| 5,920,502 A | 7/1999 | Noda et al. | |
| 5,943,254 A | 8/1999 | Bakeman, Jr. et al. | |
| 5,986,950 A | 11/1999 | Joseph | |
| 6,016,269 A | 1/2000 | Peterson et al. | |
| 6,026,476 A | 2/2000 | Rosen | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,205,564 B1 | 3/2001 | Kim et al. | |
| 6,216,247 B1 | 4/2001 | Creta et al. | |
| 6,236,587 B1 | 5/2001 | Gudesen et al. | |
| 6,407,953 B1 | 6/2002 | Cleeves et al. | |
| 6,420,215 B1 | 7/2002 | Knall et al. | |
| 6,438,044 B2 | 8/2002 | Fukuda | |
| 6,446,242 B1 | 9/2002 | Lien et al. | |
| 6,462,988 B1 | 10/2002 | Harari | |
| 6,487,749 B1 | 12/2002 | Tsui | |
| 6,498,749 B1 | 12/2002 | Cuppens et al. | |
| 6,515,923 B1 | 2/2003 | Cleeves | |
| 6,525,953 B1 | 2/2003 | Johnson | |
| 6,545,501 B1 | 4/2003 | Bailis et al. | |
| 6,567,287 B2 | 5/2003 | Scheuerlein | |
| 6,574,145 B2 | 6/2003 | Kleveland et al. | |
| 6,591,394 B2 | 7/2003 | Lee et al. | |
| 6,597,595 B1 | 7/2003 | Ichiriu et al. | |
| 6,625,073 B1 | 9/2003 | Beffa | |
| 6,658,438 B1 | 12/2003 | Moore et al. | |
| 6,661,730 B1 | 12/2003 | Scheuerlein et al. | |
| 6,728,126 B1 | 4/2004 | Issaq et al. | |
| 6,728,149 B2 | 4/2004 | Akamatsu | |
| 6,792,565 B1 * | 9/2004 | Koyama | 714/723 |
| 6,868,002 B2 | 3/2005 | Saito et al. | |
| 6,895,490 B1 | 5/2005 | Moore et al. | |
| 6,996,660 B1 | 2/2006 | Moore et al. | |
| 7,003,619 B1 | 2/2006 | Moore et al. | |
| 7,062,602 B1 | 6/2006 | Moore et al. | |
| 7,142,471 B2 | 11/2006 | Fasoli et al. | |
| 7,178,072 B2 * | 2/2007 | Mullins et al. | 714/711 |
| 7,212,454 B2 | 5/2007 | Kleveland et al. | |
| 7,257,733 B2 * | 8/2007 | Nadeau-Dostie et al. | 714/6.13 |
| 2002/0028541 A1 | 3/2002 | Lee et al. | |
| 2002/0085431 A1 | 7/2002 | Jeon et al. | |
| 2002/0124130 A1 | 9/2002 | Iida et al. | |
| 2002/0162062 A1 | 10/2002 | Hughes et al. | |
| 2002/0196687 A1 * | 12/2002 | Sauvageau et al. | 365/200 |
| 2003/0021176 A1 | 1/2003 | Hogan | |
| 2003/0115514 A1 | 6/2003 | Ilkbahar et al. | |
| 2003/0115518 A1 | 6/2003 | Kleveland et al. | |
| 2003/0120858 A1 | 6/2003 | March et al. | |
| 2004/0008554 A1 | 1/2004 | Kanamori et al. | |
| 2004/0100831 A1 | 5/2004 | Knall et al. | |
| 2004/0153744 A1 * | 8/2004 | Driscoll | 714/7 |
| 2004/0255089 A1 | 12/2004 | Unno | |
| 2004/0257891 A1 * | 12/2004 | Kim et al. | 365/200 |
| 2005/0044459 A1 | 2/2005 | Scheuerlein et al. | |
| 2005/0078537 A1 | 4/2005 | So et al. | |
| 2005/0081093 A1 * | 4/2005 | Joly et al. | 714/8 |
| 2005/0094449 A1 * | 5/2005 | Hidaka | 365/200 |
| 2005/0207244 A1 | 9/2005 | Takenaka | |
| 2006/0139988 A1 | 6/2006 | Tran et al. | |
| 2006/0140026 A1 | 6/2006 | Ilkbahar et al. | |
| 2006/0291303 A1 * | 12/2006 | Kleveland et al. | 365/200 |
| 2007/0136640 A1 * | 6/2007 | Jarrar | 714/763 |
| 2007/0171753 A1 * | 7/2007 | Morgan et al. | 365/222 |
| 2007/0174718 A1 * | 7/2007 | Fouquet-Lapar | 714/42 |
| 2007/0266202 A1 | 11/2007 | Mukaida | |
| 2008/0285365 A1 | 11/2008 | Bosch et al. | |

FOREIGN PATENT DOCUMENTS

| | | |
|---|---|---|
| WO | WO 99/14763 | 8/1998 |

OTHER PUBLICATIONS

"Circuit Technologies for 16 Mb DRAMs," Mano et al., ISSCC 1987/Session 1: MEGABIT DRAMs/Paper WAM 1.6, 2 pages, Feb. 27, 1987.

"Method for Re-Directing Data Traffic in a Write-Once Memory Device," U.S. Appl. No. 09/877,691, filed Jun. 8, 2001; inventors: James J. Tringali, Christopher S. Moore, Roger W. March, James E. Schneider, Derek Bosch, and Daniel C. Steere.

"Reed-Solomon Codes: An introduction to Reed-Solomon Codes: principles, architecture and implementation," http://www.4i2i.com/reed_solomon_codes.htm, 8 pages.

"TP 9.2: A 30ns 64Mb DRAM with Build-in-Self-Test and Repair Function," ISSCC 92 Session 9/Non-Volatile and Dynamic Rams/Paper 9.2, 2 pages, 1992.

"64M×8 Bit, 32M×16 Bit NAND Flash Memory," Samsung Electronics, 39 pages.

"Exotic memories, diverse approaches," 8 pages, www.ednasia.com, Sep. 2001.

"A Vertical Leap for Microchips: Engineers have discovered a way to pack more computing power into microcircuits: build them vertically as well as horizontally," Thomas H. Lee, 8 pages.

"Three-Dimensional Memory Array and Method of Fabrication," U.S. Appl. No. 09/560,626, filed Apr. 28, 2000; inventors: Johan Knall.

Zhang et al., "On-state reliability of amorphous silicon antifuses," IEDM Digest of Technical Papers, pp. 551-554, 1995.

Shih et al., "Characterization and modeling of a highly reliable metal-to-metal antifuse for high-performance and high-density field-programmable gate arrays," Proceedings of IEEE, Int. Reliability Physics Synp., 1997, pp. 25-33.

Office Action for U.S. Appl. No. 11/803,776, dated Sep. 17, 2009, 12 pages.

International Search Report and Written Opinion for PCT/US2008/006041, 10 pages, mailed Oct. 31, 2008.

Office Action for U.S. Appl. No. 11/803,776, 14 pages, Apr. 13, 2010.

Office Action for U.S. Appl. No. 11/803,776, 15 pages, Sep. 15, 2010.

\* cited by examiner

MEMORY DEVICE FOR REPAIRING A NEIGHBORHOOD OF ROWS IN A MEMORY ARRAY USING A PATCH TABLE

CROSS-REFERENCE TO RELATED APPLICATION

This application is related to "Method for Repairing a Neighborhood of Rows in a Memory Array Using a Patch Table," U.S. patent application Ser. No. 11/803,776, filed herewith, which is hereby incorporated by reference.

BACKGROUND

Some memory cells, such as one-time-programmable (OTP) memory cells, cannot be pre-tested to determine whether they can reliably stored data. As a result, redundancy mechanisms can be built-into a memory device, such that, if there is an error in field-programming memory cells in a normal data storage area in the memory device, the data can instead be written to a repair area in the memory device. That way, despite such errors, a data storage system can read and write to the memory device without losing any data. In some memory arrays, data that was successfully stored in a row in a memory array can become unreadable after an adjacent row is written to. For example, in a memory array with antifuse-based memory cells, a leakage path can be caused by a defect that resides in a location that is not electrically visible until the rupture of the antifuse. Once the antifuse is ruptured and a filament is formed, this defect can provide a short circuit between the row being programmed and one or both of its neighboring rows, rendering previously-stored data in a neighboring row unreadable. In such a situation, in addition to repairing the data in the row where the defect was detected, the redundancy mechanism can repair the previously-stored data from the neighboring row. This and other related redundancy mechanisms are described in U.S. Pat. No. 7,212,454.

SUMMARY

The present invention is defined by the claims, and nothing in this section should be taken as a limitation on those claims.

By way of introduction, the embodiments described below provide a memory device for repairing a neighborhood of rows in a memory array using a patch table. In one embodiment, a memory device is provided with circuitry operative to store, in a temporary storage area of the memory device, (i) first data to be stored in row N in a memory array of the memory device, (ii) second data, if any, stored in row N−1 in the memory array, and (iii) third data, if any, stored in row N+1 in the memory array. The circuitry is operative to write the first data in row N in the memory array and, in response to an error in writing the first data in row N in the memory array, to write the first data, the second data, if any, and the third data, if any, in respective rows in a repair area in the memory device. The circuitry is further operative to add the addresses of rows N−1, N, and N+1 to a table stored in the memory device, wherein the table indicates which rows in the repair area should be used instead of rows N−1, N, and N+1. Other embodiments are disclosed, and each of the embodiments can be used alone or together in combination.

The embodiments will now be described with reference to the attached drawings.

DETAILED DESCRIPTION OF THE PRESENTLY PREFERRED EMBODIMENTS

Figure 1:
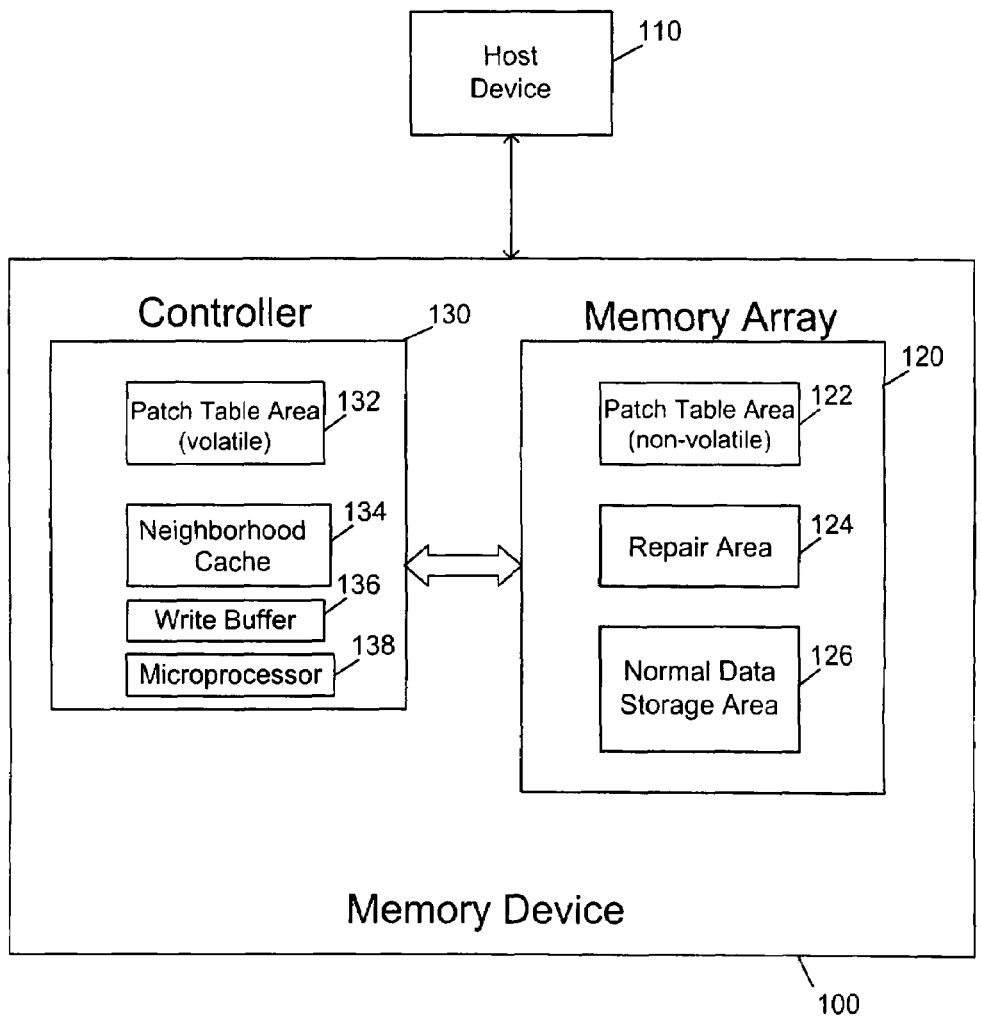
FIG. 1 is an illustration of a memory device of an embodiment in communication with a host device.

Turning now to the drawings, FIG. 1 is an illustration of a memory device 100 of an embodiment in communication with a host device 110 (not shown to scale). The host device 110 is a device that can read data from and/or write data to the memory device 100. Examples of a host device include, but are not limited to, a personal computer (PC), a notebook computer, a handheld computer, a handheld email/text message device, a handheld game console, a digital media (e.g., MP3) player, a cell phone, a video player (e.g., a DVD player or a portable video player), an audio and/or video recorder, a digital camera, a set-top box, a display device (e.g., a television), a printer, a car stereo, and a navigation system. Data can include, but is not limited to, digital media content, such as an audio file or a video file (with or without audio), an image, a game, a book, a map, a data file, or a software program. The memory device 100 can take any suitable form, such as a memory card or stick. Also, as used herein, the phrase "in communication with" means directly in communication with or indirectly in communication with through one or more components, which may or may not be shown or described herein.

The memory device 100 comprises a memory array 120 and a controller 130. Other components of the memory device 100, such as electrical connectors and other components, are not shown in FIG. 1 to simplify the drawing. The memory array 120 can take any suitable form. For example, the memory cells in the memory array 120 can be one-time programmable (OTP), few-time programmable, or re-writable. Also, the memory cells in the memory array 120 can be organized in a single layer (i.e., a two-dimensional array) or in a plurality of memory cell layers stacked vertically above one another above a single silicon substrate (i.e., a three-dimensional array), as described in U.S. Pat. No. 6,034,882 to Johnson et al. and U.S. Pat. No. 6,420,215 to Knall et al. While the memory cells preferably comprise a semiconductor material, other materials can be used, such as, but not limited to, phase-change materials and amorphous solids as well as those used with MRAM and organic passive element arrays. Preferably, the memory cells in the memory array 120 are non-volatile, although volatile memory cells can be used. It is important to note that the following claims should not be read as requiring a specific type of memory array (e.g., write-once, write-many, two dimensional, three-dimensional, etc.) unless explicitly recited therein.

In this embodiment, the memory array 120 has a patch table area 122, a repair area 124, and a normal data storage area 126. Each of these areas will be discussed in detail below. It should be noted that while FIG. 1 shows the single memory array 120 having all three areas 122, 124, 126 (the three areas 122, 124, 126 can be different address spaces in one contiguous memory array 120 instead of individual, separate areas in the array 120), one or more of these areas can be distributed to another memory in the memory device 100. Also in this embodiment, the controller 130 comprises a patch table area 132, a neighborhood cache 134, a write buffer 136, and a microprocessor 138 running firmware to perform various processing functions with respect to the memory array 120. Each of these items will be discussed in detail below. While all three of the patch table area 132, neighborhood cache 134, and write buffer 136 can be stored in a single memory in the controller 130 (such as SRAM), one or more of the patch table area 132, neighborhood cache 134, and write buffer 136 can be distributed to another memory in the controller 130 or elsewhere in the memory device 100. Additionally, while a microprocessor 138 is shown in the controller 130, it should be noted that any suitable type of circuitry can be used. "Circuitry" can include one or more components and be a pure hardware implementation and/or a combined hardware/software (or firmware) implementation. Accordingly, "circuitry" can take the form of one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example.

Figure 2:
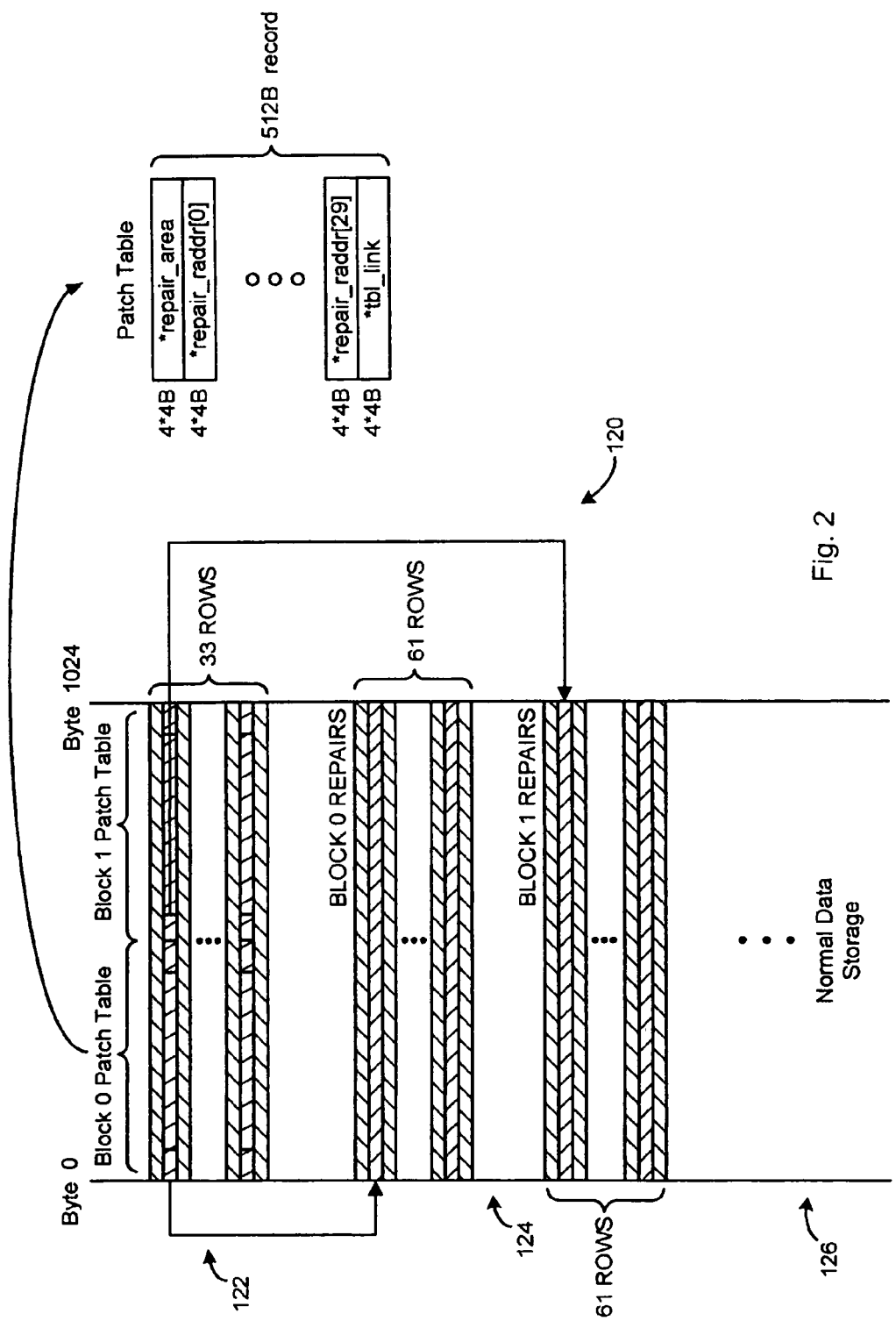
FIG. 2 is an illustration of a memory array of an embodiment.

FIG. 2 is an illustration of one particular implementation of the memory array 120. It should be noted that other implementations can be used, and the implementation of FIG. 2 should not be read into the claims unless explicitly recited therein. In this particular implementation, the memory array 120 is organized into blocks, rows (or word lines), and pages. By way of example, in this particular implementation, each block has 4,096 rows, and each row holds 1,024 bytes of data (i.e., two pages of data, each page being 512 bytes). In this implementation, the space required for the patch table area 132 and the repair area 134 are pre-allocated during memory card formatting and use about 33 KB and 2 MB, respectively. As shown in FIG. 2, the patch table area 122, repair area 124, and normal data storage area 126 are all part of the memory array 120. In this implementation, each block in the normal data storage area 126, which is at the bottom of the memory array 120, is associated with 61 rows of memory in the repair area 124. As mentioned above, other implementations can be used. For example, instead of storing two pages, a row can store a single page or more than two pages. Also, as another example, the page size can be different than 512 bytes.

The memory device 100 uses a built-in redundancy mechanism to allow rows in the normal data storage area 126 to be repaired in the repair area 124 during field programming. This built-in redundancy mechanism is performed on a low-level, access-control portion of the memory device 100. Accordingly, higher-level modules and users use the normal data storage area 126 as if it had no defects. The memory device 100 uses the patch table to perform this redundancy. As shown in FIG. 2, in this implementation, each row in the patch table area 122 in the memory array 120 comprises two patch tables: one for each of two adjacent blocks in the normal data storage area 126 of the memory array 120. The patch table has a number of fields. The top-most field indicates the physical address of the starting row in the repair area 124 for that particular block. The following 30 fields are used to store addresses of the rows in the normal data storage area 126 of the memory array 120 that were repaired. The last field (the "table link") in the patch table can store an address of another area in the memory array 120 that can be used to hold additional entries if all 30 fields have been used. In this implementation, each field is four bytes long and is stored four times in the patch table (i.e., in a quad-redundant fashion), and reconstruction of the patch table is preferably performed by a majority function to avoid the need to use ECC. There is a copy of each patch table and repair area of each physical block in the normal data storage area 126.

The patch table serves as a record of the bad rows in the normal data storage area 126 and is updated as new bad rows are found. By way of brief overview, in operation, the relevant (or all) of the patch tables stored in the patch table area 122 in the memory array 120 are loaded into the patch table area 132 in the volatile memory in the controller 130. In general, as write/read commands are received from the host device 110, the microprocessor 138 checks the appropriate patch table in the patch table area 132 in the controller 130. If the target address is not in the patch table, the write/read operation is performed on the target address. However, if the target address is in the patch table, the microprocessor 138 redirects the write/read operation to the appropriate row in the repair area 124 in the memory array 120. If, during a write operation, a row in the normal data storage area 126 in the memory array 120 is found to be bad, the address of that row is added to the appropriate patch table in the controller 130, which later updates the permanent patch table in the patch table area 122 of the memory array 120.

As mentioned in the background section above and in U.S. Pat. No. 7,212,454, which is hereby incorporated by reference, data that was successfully stored in a row in a memory array can become unreadable after an adjacent row is written to. For example, in a memory array with antifuse-based memory cells, a leakage path can be caused by a defect that resides in a location that is not electrically visible until the rupture of the antifuse. Once the antifuse is ruptured and a filament is formed, this defect can provide a short circuit between the row being programmed and one or both of its neighboring rows, rendering previously-stored data in a neighboring row unreadable. In this embodiment, the redundancy mechanism built-into the memory device 100 is designed to address this problem. This mechanism will be discussed in conjunction with the flow charts in FIGS. 3-5.

Figure 3:
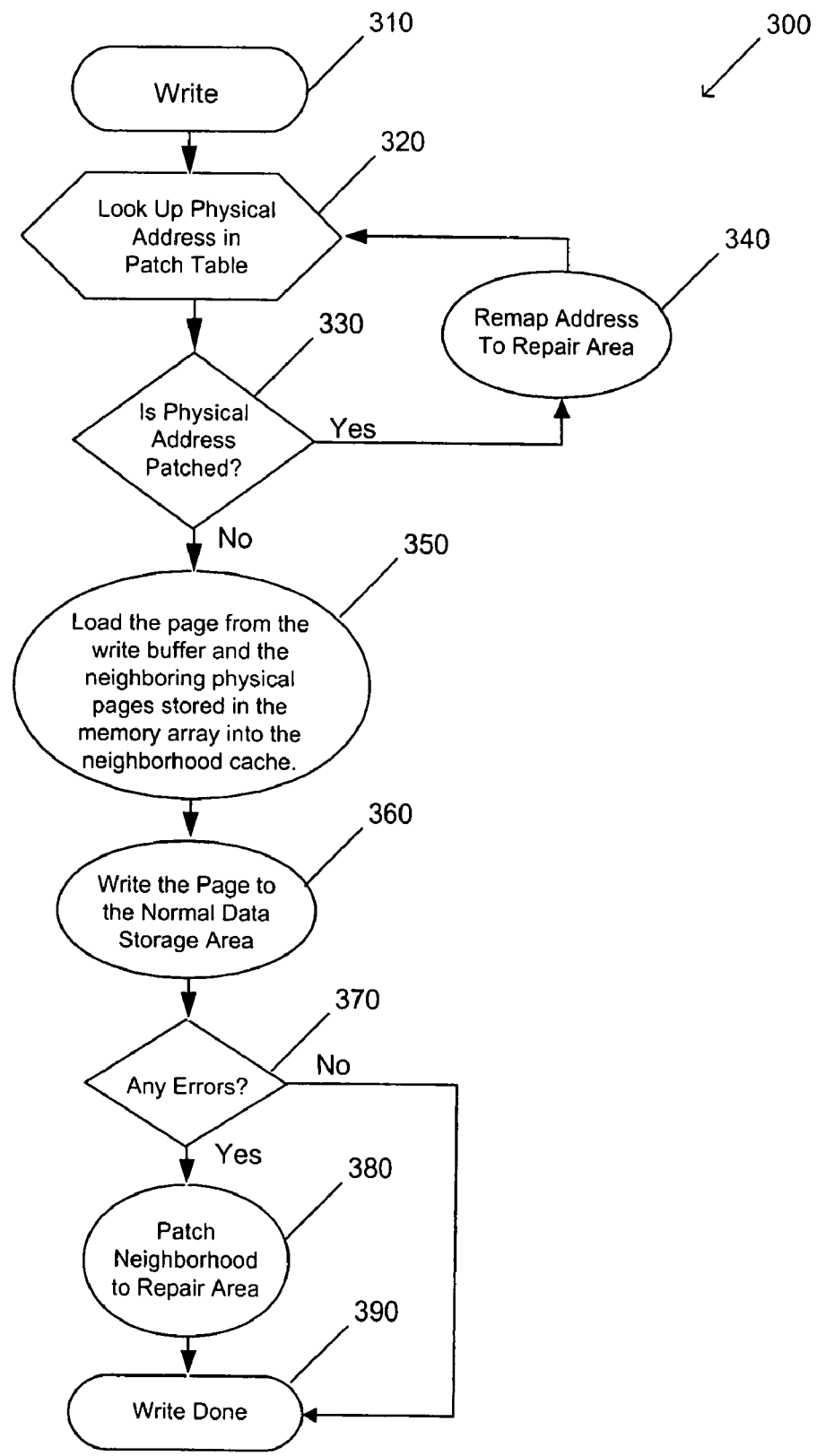
FIG. 3 is a flow chart of a write operation of an embodiment.
Figure 4:
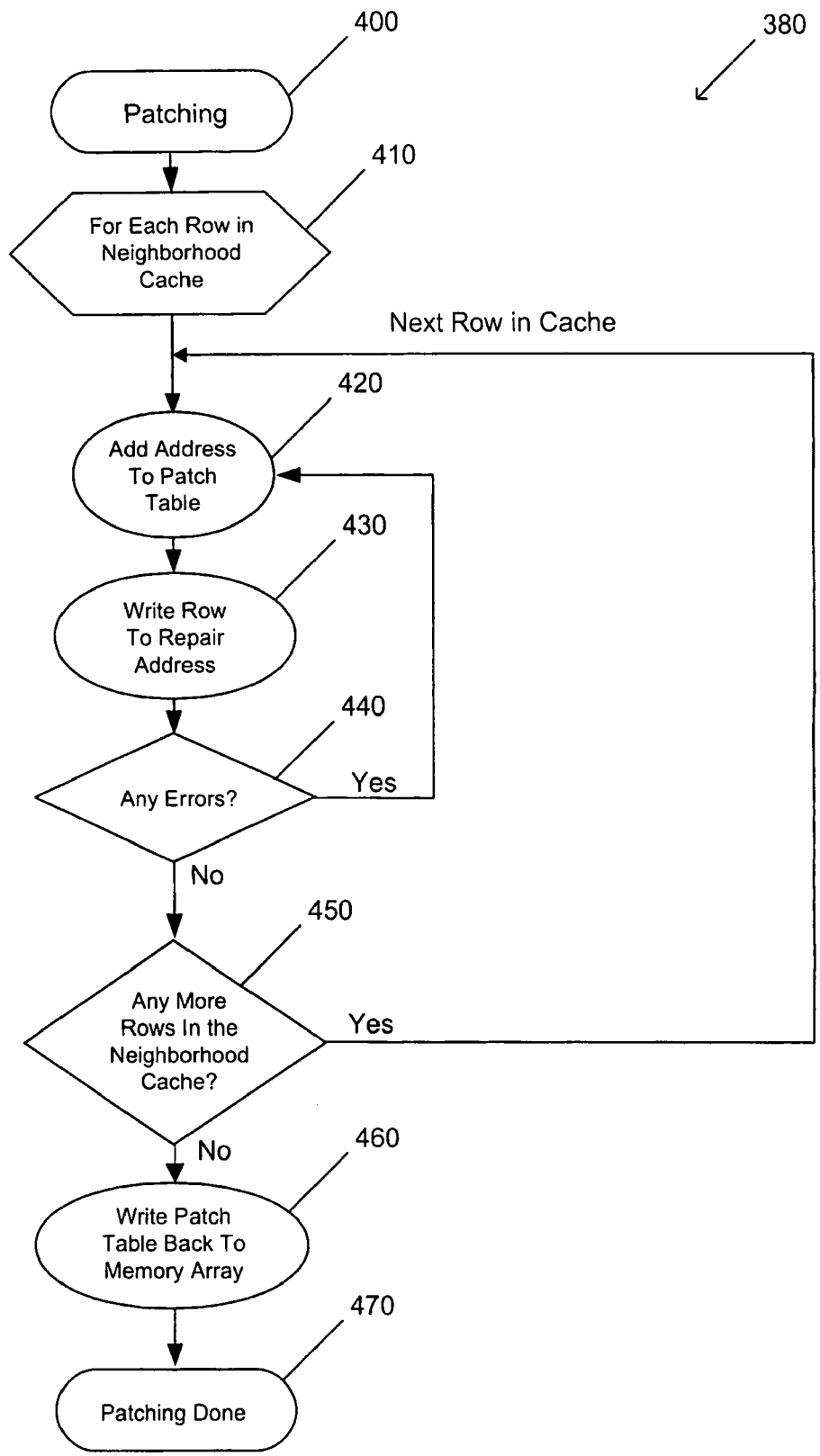
FIG. 4 is a flow chart of a patch operation of an embodiment.

FIG. 3 is a flow chart 300 of a write operation of an embodiment. First, the controller 130 receives a write command 310 from the host device I 10 to write data to a row, identified by a physical address, in the memory array 120. In this embodiment, the data is a page of data (i.e., half of a physical row). In response to a write command, the microprocessor 138 stores the page of data in the write buffer 136 and looks up the physical address in the patch table stored in the patch table area 132 in the volatile memory in the controller 130 (act 320). (The some of the patch tables (e.g., only the relevant patch table(s)) or all of the patch tables can be loaded from the memory array 120 to the controller 130 during system initialization.) By looking-up the physical address in the patch table, the microprocessor 138 determines whether the physical address is patched (act 330). If the physical address of the row is listed in the patch table, the address is remapped to an address in the repair area 124 according to the information stored in the patch table (act 340). Specifically, the patch table for the block that contains the target row is consulted. The first field in the patch table provides the starting address of the repair area for that block. In this embodiment, a direct mapping system is used, so each of the 30 repair address fields is associated with a respective row in the repair area for the block. Accordingly, the microprocessor 138 knows which row address to use in the repair area 124 based on which field in the patch table holds the target address. As the row in the repair area 124 may also be patched, acts 320 and 330 are repeated until a physical address is found that is not in the patch table.

In this embodiment, a defect on one row will render one or both of the two adjacent rows unusable, and the redundancy mechanism of the memory device 100 is able to repair all two or three rows, if necessary. To be ready to do this, before the attempt is made to write the page to the normal data storage area 126, the microprocessor 138 loads the page from the write buffer 136 and the neighboring physical pages into the neighborhood cache 134 (act 350). (If a write buffer 136 is not used, the page data to be written to the memory array 120 can be directly loaded into the neighborhood cache 134.) Accordingly, the neighborhood cache 134 in this embodiment is a three-row (six page) cache: (i) data to be stored in row N in the memory array 120 (i.e., the page of data to be written in the write operation) as well as the other page, if any, that was previously stored in row N, (ii) data, if any, stored in row N−1 in the memory array 120, and (iii) third data, if any, stored in row N+1 in the memory array 120. In this way, the neighborhood cache 134 maintains a moving window of a six-page/three-row neighborhood centered around the current physical address being accessed. "If any" refers to the fact that there may not be data stored in one or both of the neighboring rows. For example, if the normal data storage area 126 of the memory array 120 is written in a top-to-bottom fashion, when data is to be written to row N, there may be data stored in row N−1 but not in row N+1. In such a situation, only the data is to be written to row N and the data stored in row N−1 can be written to the neighborhood cache 134. However, as row N+1 may no longer be usable, it may be preferred to also load the neighborhood cache 134 with the data to be stored in row N+1. In this way, if an error occurs, data for all three rows can be written during the patch operation instead of just writing two rows and waiting for a later write operation to patch row N+1.

Returning to the flow chart 300 in FIG. 3, next, the microprocessor 138 writes the page from the write buffer 136 (or from the neighborhood cache 134) to the normal data storage area 126 of the memory array 120 (act 360) (in this example, into row N) and detects if there are any errors in writing the page (act 370). The microprocessor 138 can detect an error in any suitable manner. For example, after the page is written, the microprocessor 138 can read the data from the just-written page and compare it to the data in the write buffer 136. A mismatch between the data from the just-written page and the data from the write buffer 136 can indicate that an error occurred (e.g., because of a defect on the row). Of course, other mechanisms can be used to detect an error. For example, even if the written data matches the data in the write buffer 136, the controller 130 can be operative to detect whether a defect might be developing on the row. The term "error" is intended to cover either an actual detected error or a warning sign than an error may be developing. In another alternative, instead of checking the row just written, a row short detector can be run after every other write to check the memory at that given row to see if a short has developed to a neighbor.

If an error is not detected, the microprocessor 138 returns a "write done" message back to the host device 110 (act 390). If an error is detected, the microprocessor 138 patches the three-row neighborhood stored in the neighborhood cache 134 to the repair area 124. This operation is described in more detail in FIG. 4. As indicated by 400 and 410 in FIG. 4, the following operations are performed for each row in the neighborhood cache 134 (in this example, row N−1, N, and N+1). First, the address of the row is added to the patch table (preferable, the patch table in the controller 130, but alternatively, the patch table in the memory array 120) (act 420). After the address of the row is added to the patch table (or, in an alternate embodiment, before), the row is written to the appropriate repair address in the repair area 124 in the memory array 120. As discussed above, in this embodiment, a direct mapping system is used, so each repair address field in the patch table is associated with a respective row in the repair area 124. (Other methods can be used, such as one in which repair rows are dynamically allocated.) The microprocessor 138 then determines if there was an error in writing the data to the repair row (act 440). If there was an error, the method returns to act 420, with the same address written to the next field in the patch table. Because a direct mapping scheme is used, the second occurrence of this address will be associated with a different repair row, and acts 430 and 440 will be repeated with respect to this different repair row. As will be described in more detail below, in this embodiment, the patch table is read from bottom to top. Accordingly, during a read operation (or during a subsequent write operation, if the memory array is more than one-time programmable), the second occurrence of the address will be used to determine the appropriate repair row instead of the first occurrence of the address. If an error is detected at act 440, the above process is repeated until an error-free repair row is found.

After acts 420-440 are performed, the microprocessor 138 determines if there are any more rows in the neighborhood cache 134 (act 450). If there are no more rows, the microprocessor 138 writes the patch table back to the patch table area 122 of the memory array 120, and the patching operation is complete (act 470). If there are more rows, acts 420-450 are repeated. In this embodiment, to avoid encountering a row short in the repair area 124, each repair row in the repair area 124 is written so that the intervening rows are left blank. Data in the patch table is also written with intervening blank rows in order to provide the same defect tolerance. This is shown in the illustration of FIG. 2, where the patch table data and repair row data are shown with hatchings drawn from upper left to lower right and blank rows shown with hatchings drawn from lower left to upper right.

Figure 5:
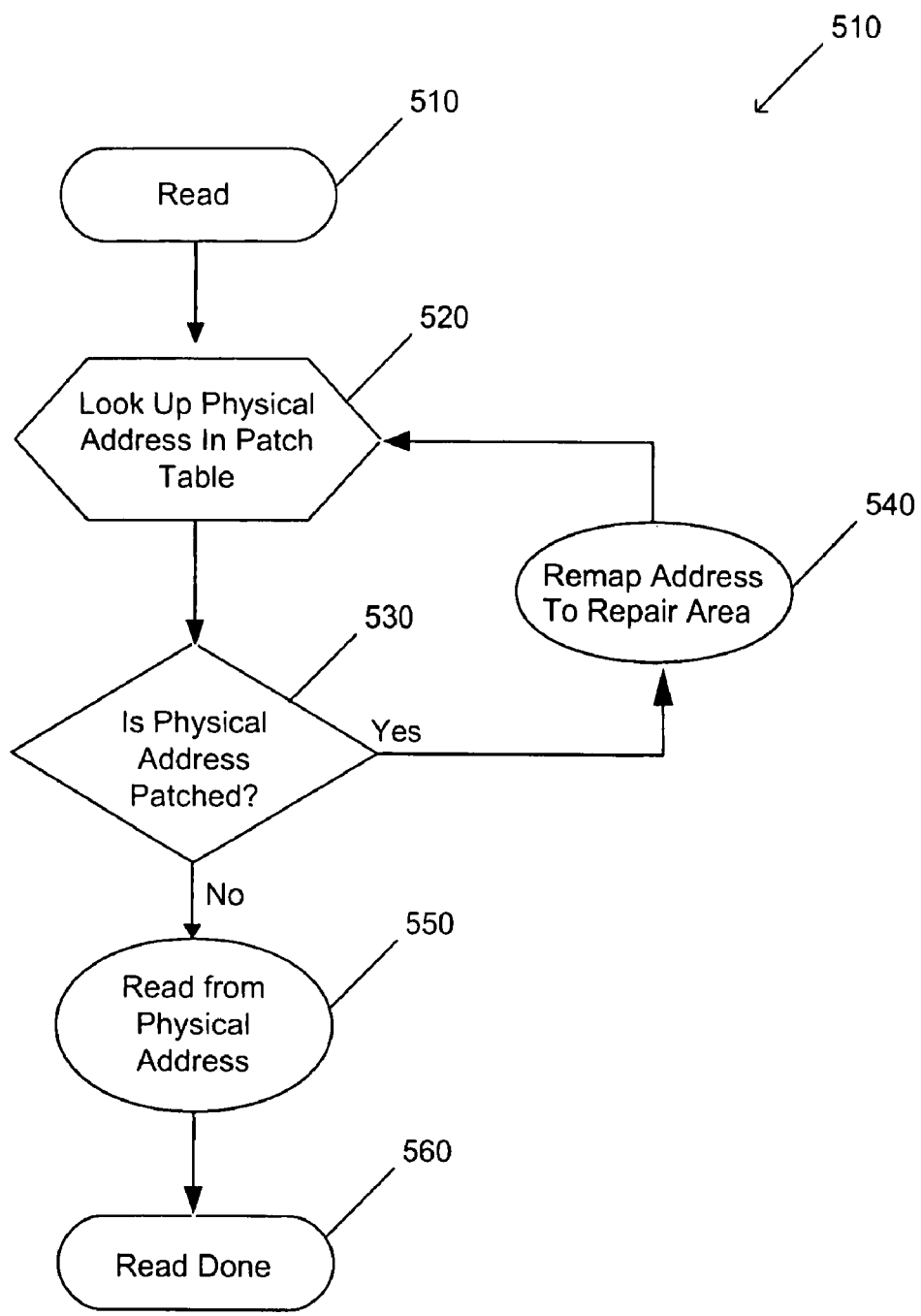
FIG. 5 is a flow chart of a read operation of an embodiment.

Returning to the drawings, FIG. 5 is a flow chart 500 of a read operation of an embodiment. First, the controller 130 receives a read command 510 from the host device 110 to read data from a row, identified by a physical address, in the memory array 120. In response to the command 510, the microprocessor 138 looks up the physical address in the patch table in the controller 130 (act 520). The microprocessor 138 determines if the physical address was patched based on the presence of the physical address in the patch table (act 530). If the physical address is in the patch table, the microprocessor 138 remaps the address to the repair area (act 540) and acts 520 and 530 are repeated. This process supports a "patch of a patched address." As mentioned above, in this embodiment, the patch table is written from top to bottom but read from bottom to top, so if a physical address occurs multiple times in the patch table, the microprocessor 138 uses the most recent address. The microprocessor 138 then reads from the address (either the original address or the remapped address) (act 550), and the read operation is done (act 560).

There are many alternatives that can be used with these embodiments. For example, in the embodiment described above, the data to be written was copied from the write buffer 134 into the neighborhood cache 134, so that, during a patch operation, the data is read out of the neighborhood cache 134 and into the repair row. In an alternate embodiment, the data to be written is not copied into the neighborhood cache 134 but is read out write buffer 134 during a patch operation. In yet another alternate embodiment, instead of using a patch table, redundancy pointers can be used to indicate a bad row and the appropriate repair row. This and other redundancy alternatives are described in more detail in U.S. Pat. Nos. 7,212,454 and 6,868,022 and U.S. Patent Application Nos. US 2006-0140026 and US 2003-0115518, each of which is hereby incorporated by reference.

Some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, the term "temporary storage area," as may be used in the claims, refers to a storage area in the memory device that stores data prior to storage in the memory array 120. As such, in the embodiment described above, the temporary storage area took the form of the neighborhood cache 134. However, as illustrated by the alternatives discussed above, the temporary storage area can additionally include the write buffer 136 and/or the patch table area 132, since each of those components stores data prior to storage in the memory array 120. The temporary storage area can be a single area in a one memory array, multiple areas in one memory array, or multiple areas in multiple memory arrays. Although the word "temporary" is used, the temporary storage area is not limited to volatile memory (such as SRAM) and can take any form. Further, the temporary storage area preferably, but not necessarily, has a smaller storage capacity than the memory array 120.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A memory device comprising:
   a memory array;
   a temporary storage area; and
   circuitry operative to:
      store, in the temporary storage area: (i) first data to be stored in row N in the memory array, (ii) second data, if any, stored in row N−1 in the memory array, and (iii) third data, if any, stored in row N+1 in the memory array;
      write the first data in row N in the memory array; and
      in response to an error in writing the first data in row N in the memory array:
         write the first data, the second data, if any, and the third data, if any, in respective rows in a repair area in the memory device; and
         add addresses of rows N−1, N, and N+1 to a table stored in the memory device, wherein the table indicates which rows in the repair area should be used instead of rows N−1, N, and N+1;
   wherein the circuitry is operative to write the first data, the second data, if any, and the third data, if any, in respective rows in the repair area such that there are intervening blank rows between the respective rows.

2. The memory device of claim 1, wherein the circuitry operative to add the addresses of rows N−1, N, and N+1 to the table such that there are intervening blank rows between the addresses in the table.

3. The memory device of claim 1, wherein the circuitry is further operative to:
   receive a command to perform one of a read or a write operation to an address of one of rows N−1, N, and N+1;
   compare the address to addresses listed in the table; and
   determine which address in the repair area should be used for said one of a read or a write operation instead of the address of said one of rows N−1, N, and N+1.

4. The memory device of claim 1, wherein third data is not stored in row N+1 in the memory array, and wherein the circuitry is further operative to:
   store, in the temporary storage area of the memory device, third data to be stored in row N+1 in the memory array; and
   in response to the error in writing the first data in row N in the memory array, write the third data in a row in the repair area in the memory device.

5. The memory device of claim 1, wherein a row stores two pages of data, wherein the first data comprises a first page of data, wherein row N stores a second page of data, and wherein the circuitry is further operative to:
   store, in the temporary storage area, the second page of data; and
   in response to the error in writing the first data in row N in the memory array, write the second page of data in a same repair row in the repair area as the first data.

6. The memory device of claim 1 further comprising a controller in communication with the memory array, wherein the temporary storage area and the circuitry are part of the controller.

7. The memory device of claim 1, wherein the memory array comprises a three-dimensional memory array comprising a plurality of memory cell layers stacked vertically above one another above a single silicon substrate.

8. A memory device comprising:
   a memory array;
   a temporary storage area; and
   circuitry operative to:
      receive an address of row N in the memory array;
      determine whether the address of row N is present in a table stored in the memory device;
      if the address of row N is present in the table, remap the address to an address in a repair area of the memory device;
      if the address of row N is not present in the table:
         store, in the temporary storage area: (i) first data to be stored in row N in the memory array (ii) second data, if any, stored in row N−1 in the memory array, and (iii) third data, if any, stored in row N+1 in the memory array;
         write the first data in row N in the memory array; and
         in response to an error in writing the first data in row N in the memory array:
            write the first data, the second data, if any, and the third data, if any, in respective rows in a repair area in the memory device; and
            add addresses of rows N−1, N, and N+1 to the table, wherein the table indicates which rows in the repair area should be used instead of rows N−1, N, and N+1;
         wherein the circuitry is operative to write the first data, the second data, if any, and the third data, if any, in respective rows in the repair area such that there are intervening blank rows between the respective rows.

9. The memory device of claim 8, wherein the circuitry is operative to add the addresses of rows N−1, N, and N+1 to the table such that there are intervening blank rows between the addresses in the table.

10. The memory device of claim 8, wherein the circuitry is further operative to remap the address of the repair area to a new address in the repair area if the address of the repair area is also present in the table.

11. The memory device of claim 8, wherein the circuitry is further operative to add an address of the row of the repair area to the table and write the data of the row to another row in the repair area if there is an error in writing the data of the row to the repair area.

12. The memory device of claim 8, wherein the circuitry is further operative to:
   receive a command to perform one of a read or a write operation to an address of one of rows N−1, N, and N+1;
   compare the address to addresses listed in the table; and
   determine which address in the repair area should be used for said one of a read or a write operation instead of the address of said one of rows N−1, N, and N+1.

13. The memory device of claim 8, wherein third data is not stored in row N+1 in the memory array, and wherein the circuitry is further operative to:
   store, in the temporary storage area of the memory device, third data to be stored in row N+1 in the memory array; and
   in response to the error in writing the first data in row N in the memory array, write the third data in a row in the repair area in the memory device.

14. The memory device of claim 9, wherein a row stores two pages of data, wherein the first data comprises a first page of data, wherein row N stores a second page of data, and wherein the circuitry is further operative to:
   store, in the temporary storage area, the second page of data; and
   in response to the error in writing the first data in row N in the memory array, write the second page of data in a same repair row in the repair area as the first data.

15. The memory device of claim 8 further comprising a controller in communication with the memory array, wherein the temporary storage area and the circuitry are part of the controller.

16. The memory device of claim 8, wherein the memory array comprises a three-dimensional memory array comprising a plurality of memory cell layers stacked vertically above one another above a single silicon substrate.

* * * * *